(12) United States Patent
Komagata (10) Patent No.: US 7,049,611 B2
(45) Date of Patent: May 23, 2006

(54) CHARGED-PARTICLE BEAM LITHOGRAPHIC SYSTEM

(75) Inventor: Tadashi Komagata, Tokyo (JP)

(73) Assignee: JEOL Ltd., Tokyo (JP)

(*) Notice: Subject to any disclaimer, the term of this patent is extended or adjusted under 35 U.S.C. 154(b) by 0 days.

(21) Appl. No.: 10/956,620

(22) Filed: Oct. 1, 2004

(65) Prior Publication Data

US 2005/0116180 A1 Jun. 2, 2005

(30) Foreign Application Priority Data

Oct. 3, 2003 (JP) ............... 2003-345122

(51) Int. Cl.
*G01K 1/08* (2006.01)

(52) U.S. Cl. ............... 250/492.23; 250/397; 250/492.2; 250/398; 250/491; 219/121.25; 315/382

(58) Field of Classification Search ............... None
See application file for complete search history.

(56) References Cited

U.S. PATENT DOCUMENTS

| 5,173,582 A | * | 12/1992 | Sakamoto et al. | ..... 219/121.25 |
| 6,207,965 B1 | * | 3/2001 | Koike | ............ 250/492.23 |
| 6,897,454 B1 | * | 5/2005 | Sasaki et al. | ............ 250/492.1 |

FOREIGN PATENT DOCUMENTS

| JP | 58005954 | 1/1983 |
| JP | 8264420 | 10/1996 |

* cited by examiner

*Primary Examiner*—Nikita Wells
*Assistant Examiner*—Zia R. Hashmi
(74) *Attorney, Agent, or Firm*—The Webb Law Firm (57) ABSTRACT

When the focal point of the objective lens of a charged-particle beam lithographic system is shifted according to the deflection position within a writing field, the image magnification of the objective lens will vary. In the present invention, the focal point of the objective lens is shifted in a corresponding manner to deflection positions in X- and Y-directions, respectively. Amounts of variations in the image magnification are previously measured, as well as the amounts of shifts. The results are stored in a memory. During lithographic writing, the focus of the objective lens is varied by referring to the memory according to the deflection positions. The size and position of a pattern to be written are corrected by controlling a shaping deflector and a positioning deflector.

13 Claims, 3 Drawing Sheets

CHARGED-PARTICLE BEAM LITHOGRAPHIC SYSTEM

BACKGROUND OF THE INVENTION

1. Field of the Invention

The present invention relates to a charged-particle beam lithographic system for writing a desired pattern on a mask substrate or silicon wafer by an electron beam or ion beam.

2. Description of Related Art

An electron-beam lithographic system is used during a process in which a mask for creating semiconductor devices is fabricated. One example of this is a variable-area electron-beam lithographic system that writes a desired pattern by deflecting an electron beam while varying the cross-sectional area of the beam directed at a workpiece. In this system, the electron beam produced from the electron gun is directed at a first aperture having a rectangular opening. The beam transmitted through the first aperture is directed at a second aperture having a rectangular opening.

A shaping deflector is disposed between the first and second apertures. The electron beam can be shaped into an arbitrary cross-sectional area by deflecting the beam transmitted through the first aperture. An arbitrary pattern can be written on the workpiece by directing the shaped beam at the workpiece and deflecting the beam arbitrarily by the shaping deflector.

Where the shaped electron beam is deflected, if the deflection angle is increased, deflection distortion cannot be neglected. Therefore, the written region is divided into "fields" in which the deflection distortion of the beam can be neglected. The workpiece is moved field by field. Each part of a desired pattern is written on each field.

However, as lithographic patterns have become finer, slight deflection distortion and defocus within such fields have presented problems. Accordingly, as deflection is performed, defocus corresponding to the deflection angle needs to be corrected. It is also necessary to correct defocus due to Coulombic repulsive force varying according to variation of the size of the cross-sectional area of the illuminating beam, i.e., variation of the amount of current. Further, it is necessary to correct defocus corresponding to slight local height variations on the workpiece. A method of correcting defocus corresponding to the deflection angle is described, for example, in Japanese Patent No. 58005954. In this known method, the amount of correction is calculated based on distances x and y on the focal image plane due to deflection. The defocus is corrected by an auxiliary lens mounted close to the focusing lens.

Furthermore, an example of correction of defocus due to Coulombic repulsive force varying according to variation of the size of the cross-sectional area of the illuminating beam, i.e., variation of the amount of current, is described in Japanese Patent No. 08264420. This technique is variable-area charged-particle beam lithography in which correcting values corresponding to beam sizes are stored in a table for focus correction. During writing, a correcting value corresponding to a beam size is read from the table. A correcting signal corresponding to this correcting value is supplied to the focus-correcting lens. In this way, blur in the beam (i.e., defocus) due to variation of the beam size, i.e., variation of the current of the illuminating beam, is corrected.

However, as finer lithographic patterns are used, if defocus is corrected simply by using a focus-correcting lens, the following issues come to surface.

Figure 2:
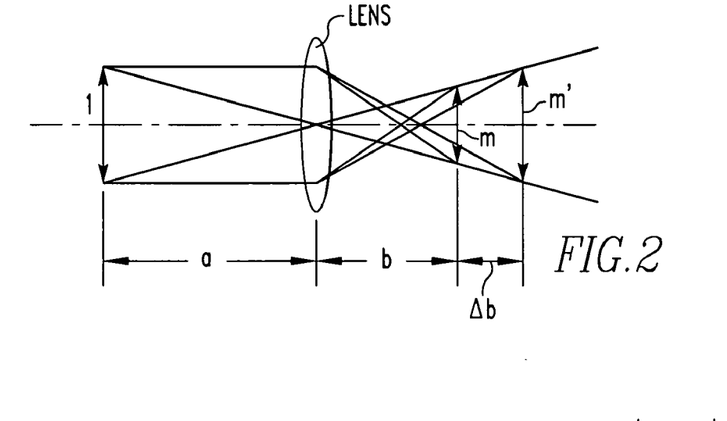
FIG. 2 is a ray diagram illustrating the principles of problems with the prior art.

FIG. 2 is a principle beam diagram illustrating the issues. An object plane is located ahead of (on the left side of, as viewed in the figure) a lens and at a distance of a from the lens. It is assumed that an image at the object plane has a size of 1 and that an image at a rear image plane focused at a position at a distance of b from the lens has a size of m. If the distance from the lens to the image plane increases by Δb, the size of the image varies to m'. That is, the magnification of the image is affected by variation of the strength (excitation) of the lens.

In reality, this will present no problem in correcting defocus due to Coulomb repulsive force corresponding to the beam size, which is the object of Japanese Patent No. 08264420. However, where defocus is produced due to varying angle of deflection during deflection or due to height variations on the workpiece, if the defocus is corrected using a focus-correcting lens or the like, a problem arises.

SUMMARY OF THE INVENTION

In order to solve the foregoing problem with the prior art, it is an object of the present invention to provide a lithographic method offering an improved writing accuracy by correcting variations in the image magnification caused by variations in the strength (excitation) of a lens.

This object is achieved by a charged-particle beam lithographic system according to the present invention, the system being designed (a) to create an image of the opening of a first aperture, (b) to focus the image onto a second aperture by a shaping lens, (c) to place the image in position on the second aperture by a shaping deflector, (d) to focus a charged-particle beam, which has a cross section of desired size and has been transmitted through the opening of the second aperture, by an objective lens, (e) to direct the focused beam at a workpiece, and (f) to deflect the charged-particle beam according to a deflection signal supplied to a positioning deflector to deflect the beam to vary the irradiation position on the workpiece. This system (A) corrects the size by controlling the shaping deflector according to the strength of the objective lens. Furthermore, the system (B) corrects the irradiation position on the workpiece by controlling the positioning deflector based on the correction of the size.

In one feature of the present invention, the strength of the objective lens is varied according to the height of the workpiece or according to the deflection signal supplied to the positioning deflector.

The present invention also provides a charged-particle beam lithographic system designed (a) to create an image of the opening of a first aperture, (b) to focus the image onto a second aperture by a shaping lens, (c) to place the image in position on the second aperture by a shaping deflector, (d) to focus a charged-particle beam, which has a cross section of desired size and has been transmitted through the opening of the second aperture, by an objective lens, (e) to direct the focused beam at a workpiece, and (f) to deflect the charged-particle beam according to a deflection signal supplied to a positioning deflector to deflect the beam to vary the irradiation position on the workpiece. In this system, the strength of the objective lens is corrected according to the strength of the deflection signal to the positioning deflector (A). Similarly, the shaping deflector is controlled to correct the size (B). The irradiation position on the workpiece is corrected by controlling the positioning deflector based on the correction of the size (C).

As described previously, the charged-particle beam lithographic system according to the present invention (A) corrects the size by controlling the shaping deflector according to the strength of the objective lens and (B) corrects the irradiation position on the workpiece by controlling the positioning deflector based on the correction of the size. By performing the correction (A), the size of the pattern written on the workpiece is not affected by variations in the state of the focus of the objective lens. By performing the correction (B), the writing position is kept unchanged. Furthermore, the strength of the objective lens is varied according to the height of the workpiece and so defective connections in the pattern due to difference in size between different height portions on the workpiece can be prevented. Also, defective connections in the pattern due to shifting of the writing position can be circumvented.

Furthermore, the size is (A) corrected by controlling the shaping deflector according to the strength of the objective lens. The irradiation position on the workpiece is (B) corrected by controlling the positioning deflector based on the correction of the size. Furthermore, the strength of the objective lens is varied according to the deflection signal supplied to the positioning deflector. By performing the correction (A), the size of the pattern written on the workpiece remains unchanged if the state of the focus of the objective lens is varied in a correcting manner to defocus due to curvature of image field. By performing the correction (B), the writing position is corrected in a corresponding manner to the correction of the size. Accordingly, written pattern portions in the field are made uniform in size. Defective connections in the pattern due to nonuniform sizes can be prevented. Also, defective connections in the pattern due to nonuniform sizes between adjacent fields can be prevented.

Alternatively, the strength of the objective lens is corrected (A) according to the strength of the deflection signal to the positioning deflector. Similarly, the shaping deflector is controlled according to the strength of the deflection signal to (B) correct the size. As the size is corrected, the positioning deflector is (C) controlled to thereby correct the irradiation position on the workpiece. By performing the correction (A), defocus due to curvature of image field is corrected. By performing the correction (B), the size of the pattern written on the workpiece is kept unchanged. By providing the control (C), the writing position is corrected in a correcting manner to the correction of the size. Accordingly, written pattern portions in the field are made uniform in size. Defective connections in the pattern due to nonuniform sizes can be prevented. Also, defective connections in the pattern due to nonuniform sizes between adjacent fields can be prevented.

Other objects and features of the present invention will appear in the course of the description thereof, which follows.

DESCRIPTION OF THE PREFERRED EMBODIMENTS

Figure 1:
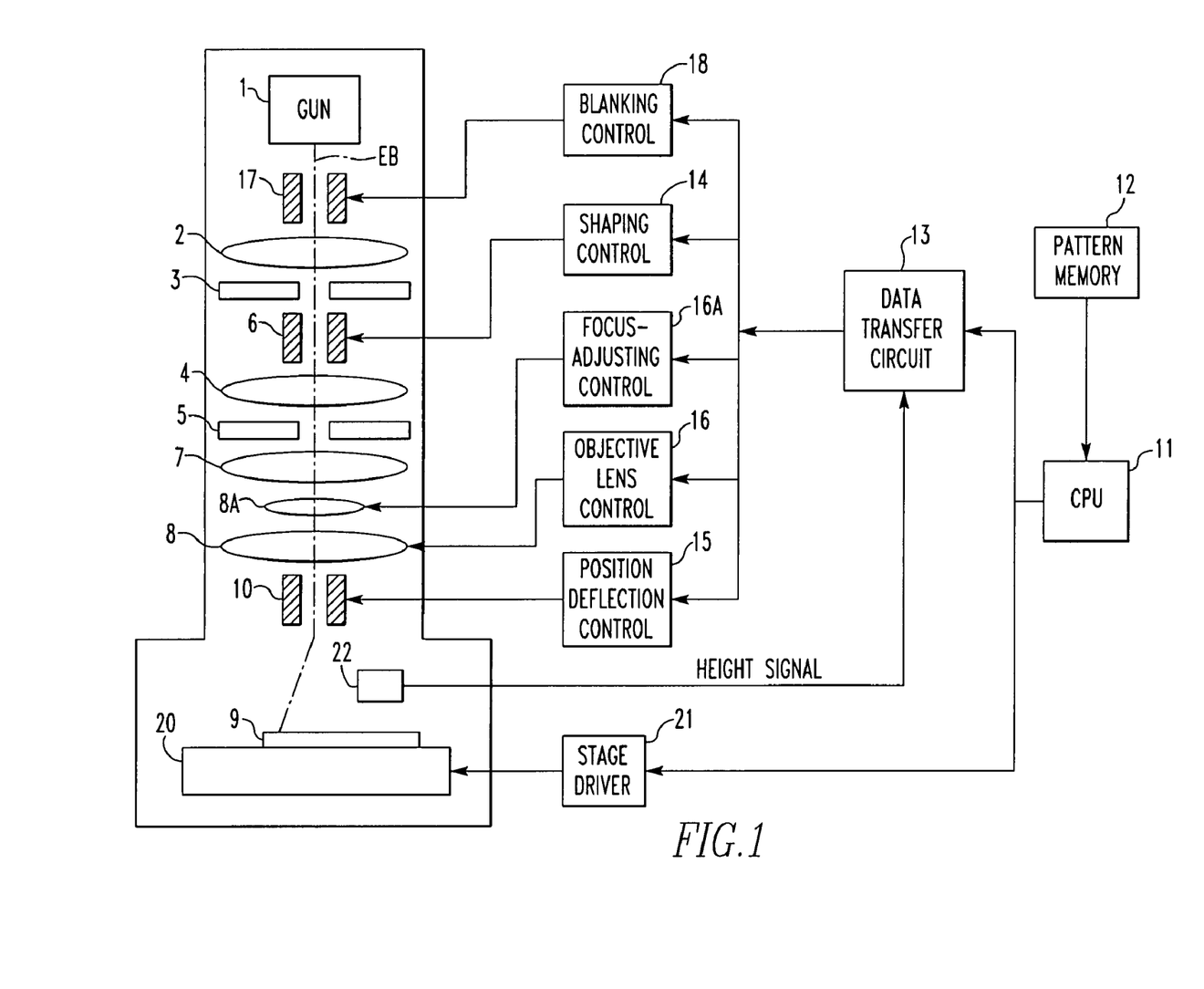
FIG. 1 is a block diagram illustrating the structure and operation of a charged-particle beam lithographic system according to the present invention.

The preferred embodiments of the present invention are hereinafter described in detail with reference to the drawings. FIG. 1 shows a variable-area electron beam lithographic system for implementing the present invention. The system has an electron gun 1 producing an electron beam EB, which is directed onto a first shaping aperture (first slit) 3 via an illumination lens 2.

An image of the opening of the first shaping aperture is focused onto a second shaping aperture (second slit) 5 by a shaping lens 4. The position of the focused image can be varied by a shaping deflector 6. The image shaped by the second shaping aperture 5 is projected onto a workpiece 9 through a reduction lens 7, a focus-adjusting lens 8A, and an objective lens 8. The irradiation position on the workpiece 9 can be varied by a positioning deflector 10. The focus-adjusting lens 8A is a lens auxiliary to the objective lens 8, and is used to finely adjust the focus of the objective lens 8. For convenience of illustration, the focus-adjusting lens 8A is described as if it were an electromagnetic lens. Where high-speed response is taken into account, an electrostatic lens is rather preferable.

The system further includes a control CPU 11 that transfers pattern data from a pattern data memory 12 to a data transfer circuit 13. The pattern data from the data transfer circuit 13 is supplied to all of a control circuit 14 controlling the shaping deflector 6, a control circuit 15 controlling the positioning deflector 10, a control circuit 16 controlling the excitation of the objective lens 8, a control circuit 16A controlling the excitation of the focus-adjusting lens 8A, and a blanker control circuit 18 controlling a blanker (blanking electrode) 17 that blanks the electron beam produced from the electron gun 1.

The control CPU 11 controls a driver circuit 21 for a workpiece stage 20 on which the workpiece 9 is placed, in order to move the workpiece 9 field by field. To accurately measure the height of the workpiece 9 (i.e., the amount of deviation from a reference height), a height-measuring device 22 utilizing light, for example, is mounted. The results of the measurement made by the height-measuring device 22 are sent to the data transfer circuit 13. Where the height of the workpiece 9 is equal to the reference height, the amount of deviation from the reference height has a proportional relation to the excitation of the focus-adjusting lens 8A if the excitation of the lens 8A is set to zero and the beam is accurately focused onto the workpiece 9 only by the objective lens 8. Based on this relation, the data transfer circuit 13 can find the amount of excitation of the focus-adjusting lens 8A from the amount of deviation of the height. The data transfer circuit 13 controls the focus-adjusting lens 8A according to the amount of deviation of the height from the height-measuring device 22 via the focus-adjusting lens control circuit 16A such that the beam is focused onto the workpiece 9. Furthermore, there is a laser interferometer metrology system (not shown) for measuring the amount of movement of the stage 20. The operation of the structure described so far is next described.

The fundamental writing operation is first described. The pattern data stored in the pattern data memory 12 are successively read out by the control CPU 11 and supplied to the data transfer circuit 13. The control circuit 14 controls the shaping deflector 6 according to the data from the data transfer circuit 13. The control circuit 15 controls the positioning deflector 10. Furthermore, the data transfer circuit 13 controls the focus-adjusting lens 8A via the focus-adjusting lens control circuit 16A according to a signal from the height-measuring device 22. Thus, the beam is accurately focused onto the workpiece 9.

As a result, the cross section of the electron beam is shaped into an element of a pattern by the shaping deflector 6 according to each piece of the pattern data. Successive elements of the pattern are projected onto the workpiece 9. In this way, the pattern of the desired shape is written. At this time, the electron beam is blanked by the blanking signal from the blanker control circuit 18 to the blanker 17 in synchronism with the irradiation of the workpiece 9 with the electron beam.

When a different region on the workpiece 9 is written, the stage 20 is moved a given distance under instructions given from the control CPU 11 to the stage driver circuit 21. This distance is being monitored by the laser metrology system (not shown). The position of the stage 20 is accurately controlled according to the results of the metrology performed by the laser metrology system.

Figure 3:
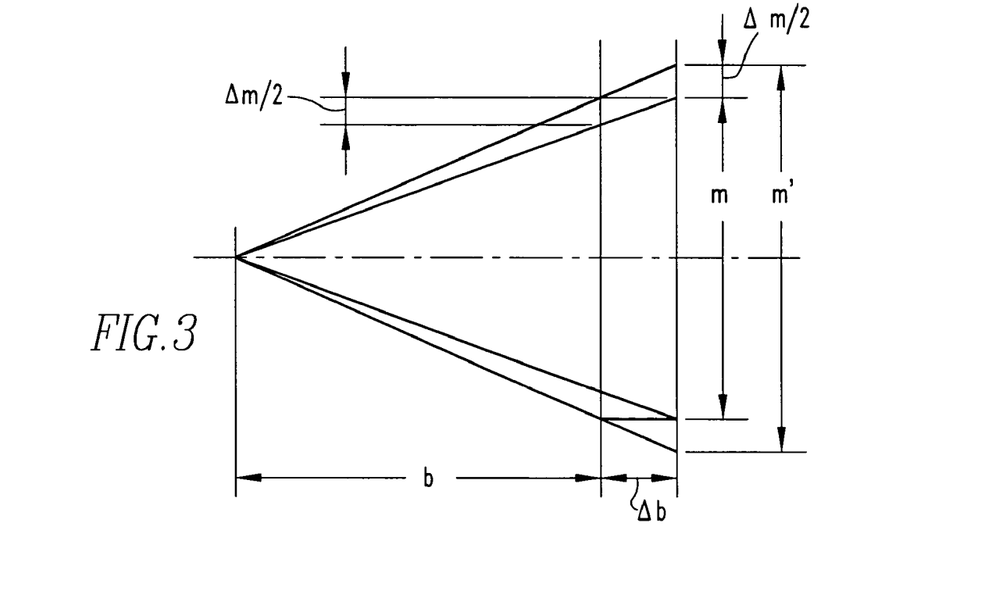
FIG. 3 is a ray diagram illustrating the principle of correction of size according to the present invention.
Figure 4:
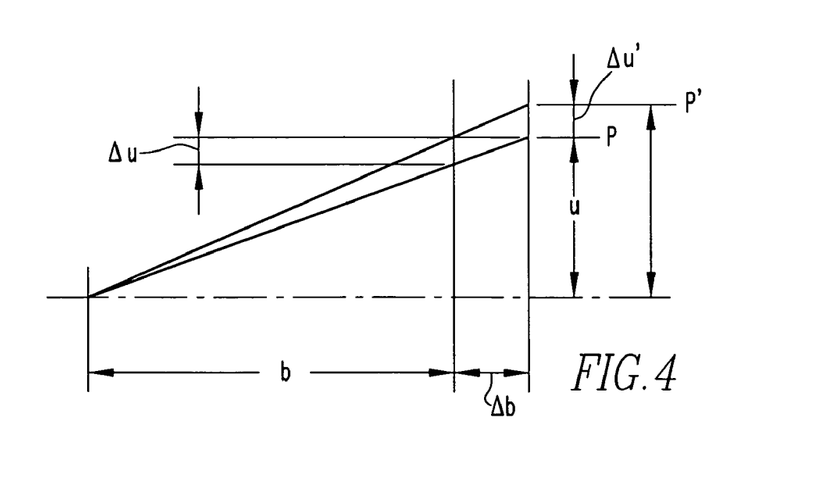
FIG. 4 is a ray diagram illustrating a principle associated with the irradiation position within each field in accordance with the present invention.
Figure 5A:
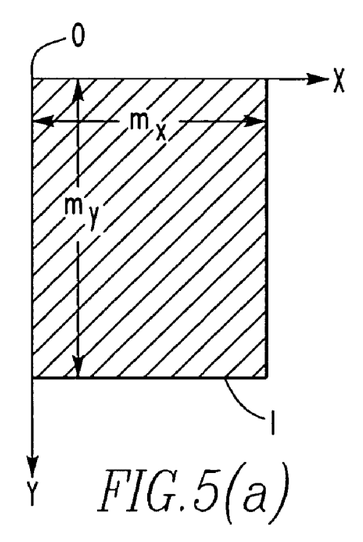
FIGS. 5(a)–5(c) illustrate the principle of correction of the irradiation position within each field made concomitantly with correction of the size of the image in accordance with the present invention.
Figure 5B:
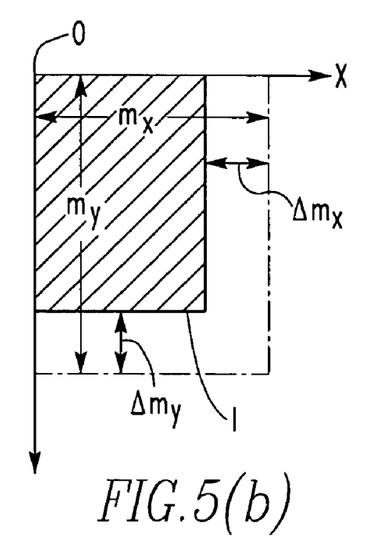
Figure 5C:
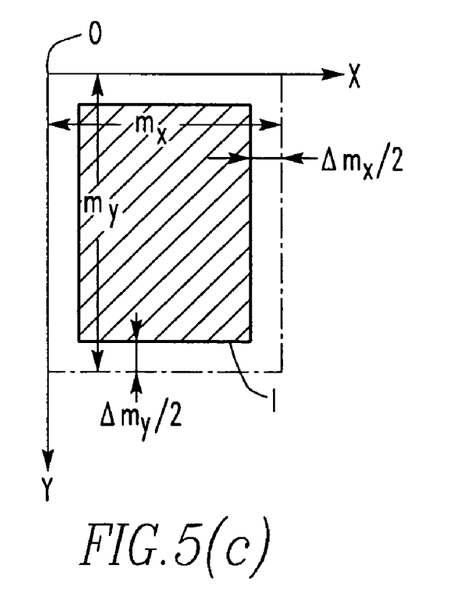

The principle of the present invention is next described in detail with reference to FIGS. 3, 4, and 5(*a*)–5(*c*). FIG. 3 is a principle beam diagram illustrating the relation between the variation in the lens strength and image size. FIG. 4 is a principle diagram illustrating the relation between the variation in the lens strength and the position of the image in a field. FIGS. 5(*a*)–5(*c*) illustrate the principle of a correction to the writing position within a field made concomitantly with a correction of the size of an image.

Referring particularly to FIG. 3, it is assumed that an image has a size of m when the distance from the objective lens 8 to the image plane is b. At this time, if the strength of the objective lens 8 is varied to increase the distance b from the objective lens 8 to the image plane by $\Delta b$, the size of the image is increased by $\Delta m$, i.e., increases to $m'(=m+\Delta m)$. If the size of the written image is kept constant in spite of this, the size (or dimension) whose data is sent to the shaping deflector control circuit 14 should be set to $(m-\Delta m)$. From FIG. 3, we obtain $\Delta m = m \cdot \Delta b/(b+\Delta b)$. Since the variation $\Delta b$ in the distance to the image plane is sufficiently smaller than the distance b, an approximation $\Delta m = m \cdot \Delta b/b$ can be obtained. Accordingly, the size whose data is sent to the shaping deflector control circuit 14 should be set to $(m - m \cdot \Delta b/b)$.

The distance b from the objective lens 8 to the image plane is constant. It can be assumed that if the strength i of the focus-adjusting lens 8A is varied, the variation $\Delta b$ in the distance varies in proportion to the strength. The variation is given by $\Delta i$. An equality $k \cdot \Delta i = \Delta b/b$ can be obtained, where k is a proportionality coefficient. The size whose data is sent to the shaping deflector control circuit 14 is $(m - m \cdot k \cdot \Delta i)$. Let $z_0$ be the reference height of the workpiece 9. Let $\Delta z$ be the variation in the height of the workpiece 9. Thus, we have $\Delta i = (\Delta z/z_0)/k$. The proportionality coefficient k can be measured in practice, for example, in the manner described below.

The beam is focused onto the workpiece 9 having a first height by the objective lens 8 and focus-adjusting lens 8A. This lens 8A is controlled according to the signal from the height-measuring device 22. First, the amount of excitation of the focus-adjusting lens 8A and the height of the workpiece 9 measured by the height-measuring device 22 are recorded. Then, the beam is focused onto the workpiece 9 having a second height different from the first height using only the focus-adjusting lens 8A without varying the excitation of the objective lens 8. The amount of excitation of the adjusting lens 8A and the height of the workpiece 9 measured by the height-measuring device 22 are recorded.

Based on these results, the relation (=proportionality coefficient k) between the difference between the first and second heights of the workpiece 9 and the amount of variation in the excitation of the focus-adjusting lens 8A is found. The relation is stored, for example, in the first memory within the data transfer circuit 13. The product of the amount of excitation of the focus-adjusting lens 8A and the coefficient may also be stored in the form of a table in the first memory. Various values of the amount of excitation of the focus-adjusting lens 8A are given with respect to values of the height of the workpiece 9 measured by the height-measuring device 22. In either case, high-speed processing should be enabled during lithographic writing.

A case in which the writing position is controlled by the positioning deflector 10 within each field is next described. The curvature of image field due to the positioning deflector 10 is neglected for the moment.

Where the height of the workpiece 9 varies, the writing position will deviate even if the deflection strength of the positioning deflector 10 (e.g., the deflection voltage in a case where an electrostatic deflector is used) is kept constant. That is, in FIG. 4, a writing position P is at a distance of u from an optical axis. If the distance between the deflector and the workpiece varies from b by $\Delta b$, the writing position P varies to P'. If the position P should be kept unchanged in spite of this, the deflection distance should be set to $(u-\Delta u)$. From FIG. 4, we obtain $\Delta u = u \cdot \Delta b/(b+\Delta b)$. Since the variation $\Delta b$ in the distance to the image plane is sufficiently smaller than the distance b, an approximation $\Delta u = u \cdot \Delta b/b$ can be obtained. Therefore, the position deflected by the deflection strength whose data is sent to the positioning deflector 10 should be set to $(u - u \cdot \Delta b/b)$.

Accordingly, for example, the deflection width achieved by the deflector 10 on the workpiece having the first height and the deflection width on the workpiece having the second height are measured while maintaining constant the deflection strength of the deflector 10. Since the height b of the workpiece and deflection width u can be regarded to have a proportional relation at this time, the proportionality coefficient $h = u/b$ is found and stored in the first memory. The deflection strength of the deflector 10 can be corrected such that it is kept constant irrespective of the height of the workpiece 9 if based on data about the coefficient h and height of the workpiece 9 measured by the height-measuring device 22.

In particular, the position deflected with the deflection strength of the positioning deflector 10 may be set to $(u - h \Delta b)$. Alternatively, if the variation from the reference height $z_0$ of the workpiece 9 is set to $\Delta z$, the position may be $(u - h \Delta z)$. The writing position can be kept unchanged if the height of the workpiece 9 varies, by controlling the positioning deflector 10 at the corrected deflection strength via the positioning deflector control circuit 15 from the data transfer circuit 13.

Where the size of the image written as described above is corrected, it is necessary to correct the writing position concomitantly with the correction of the size of the image. This is next described.

As shown in FIG. 5(*a*), the origin O of an image I to be written lies not in the center of the image but at one end of the image (e.g., on the left end of the image). Accordingly, if the image size is corrected as mentioned previously, the writing position at one end of the image does not vary as shown in FIG. 5(b) but the other positions vary. In FIG. 5(b), $\Delta m_x$ and $\Delta m_y$ indicate amounts of corrections made to the sizes in the X- and Y-directions, respectively. Accordingly, as shown in FIG. 5(c), it is necessary that the center position of the image remain unchanged when the size of the image is corrected. Otherwise, a gap would be produced between adjacently projected image portions or they would be overlapped. Accordingly, where a correction is made in such a way that the size m of an image is reduced by $\Delta m$, the writing position is shifted by a half of the amount of correction, i.e., $\Delta m/2$, toward the other end of the image. For example, if the writing position in the X-direction is x and if the size of the image is reduced by $\Delta m_x$ and becomes equal to $(m_x-\Delta m_x)$, the writing position after the correction is set to $(x+\Delta m_x/2)$. The same theory is applied to the Y-direction.

A case in which the writing position is controlled by the positioning deflector 10 having image field curvature in each field is next described. In this case, even if the height of the workpiece 9 is constant, when the deflection strength varies, a gap is concomitantly produced between the image plane and the height of the workpiece 9 due to curvature of image field of the positioning deflector 10. Consequently, focusing must be achieved over the whole field by varying the focus of the focus-adjusting lens 8A. That is, the strength of the adjusting lens 8A is varied as a function of each coordinate (x, y) within the field. Therefore, in the above embodiment, the strength of the focus-adjusting lens 8A is controlled according to the signal from the height-measuring device 22. In this embodiment, the strength of the focus-adjusting lens 8A is also controlled according to the coordinates (x, y) in the field.

If deflection is performed at the deflection strength proportional to the coordinates (x, y) in the field by the deflector having aberration as described above, a strict proportional relation does not exist between the deflection strength and the amount of deflection (i.e., the distance from the center of the field to the deflected position) on the workpiece 9. Accordingly, the relation between the deflection strength and each deflected position is previously measured and stored in a memory as two tables regarding X- and Y-directions, respectively, for example. During writing, the deflection strength is corrected at each coordinate (x, y) in the field by referring to the table such that the beam is deflected into correct positions. This correction is conveniently referred to herein as "correction of the deflection strength made concomitantly with deflection". The aforementioned correction of the size of the field made concomitantly with variations in the height of the workpiece is referred to as the "correction of the size of the field concomitantly with variations in the height".

To control the strength of the focus-adjusting lens 8A according to the coordinates (x, y) in the field, it is necessary to actually measure the values of the writing position to be sent to the positioning deflector control circuit 15, e.g., the relation between the value x in the X-direction and the amount of variation $\Delta i$ of the focus of the focus-adjusting lens 8A for making a focus adjustment according to the curvature of image field, as described below.

The amount of excitation of the focus-adjusting lens 8A when the beam is focused onto the workpiece 9 using the objective lens 8 and adjusting lens 8A in the center of the field is recorded. Then, the beam is focused onto the workpiece 9 using only the adjusting lens 8A without varying the excitation of the objective lens 8 while the beam is deflected some distance in the X-direction within the field. The amount of excitation of the lens 8A obtained at this time is recorded. Measurements are performed over plural points. Interpolation may be done between these points.

Similar operations are performed in the Y-direction. Based on these results, the relation between the distance from the origin of the field and the amount of variation of the excitation of the focus-adjusting lens 8A is found for both the X- and Y-directions. The results are stored, for example, in a second memory within the data transfer circuit 13. The relations of the amount of excitation of the focus-adjusting lens 8A to the distances taken in the X- and Y-directions or to the amount of deflection are stored in the form of two tables regarding the X- and Y-directions, respectively, in the second memory. The amount of excitation of the focus-adjusting lens 8A is quickly obtained from the distance or amount of deflection. Also, in this embodiment, high-speed processing should be enabled during writing. It is assumed that coordinates regarding the "correction of the deflection strength made concomitantly with deflection" described above and the corrective coefficient are stored in a third memory similar to the foregoing.

When a focus adjustment is made by the focus-adjusting lens 8A in this way, the size of the image varies as mentioned previously. It is assumed that the image has a size of m. Let $(m-m\cdot k\,\Delta i)$ be the size of the image whose data is sent to the shaping deflector control circuit 14. $\Delta i$ is the amount of variation of the strength of the lens 8A. k is the aforementioned proportionality coefficient. The size of the image is corrected using the amount of variation $\Delta i$ of the strength of the lens 8A and proportionality coefficient k.

Concomitantly with the correction of the size of the image, the writing position is corrected in the same way as in the above-described embodiment. That is, where the writing position in the X-direction is x and the amount of correction to the image size is $\Delta m_x(=-m_x\cdot k\,\Delta i)$, for example, the writing position after the correction is $(x+\Delta m_x/2)$. Of course, this correction of position is made simultaneously with the "correction of the deflection strength made concomitantly with deflection" and the "correction of the size of the field concomitantly with variations in the height". These are summarized as follows.

(1) First, the amount of correction to the field size is calculated by referring to the first memory and based on the information from the height-measuring device 22 that measures the height of the workpiece 9. Based on the results, the positioning deflector control circuit 15 is controlled.

(2) In addition to the above-described correction, the amount of correction to the deflection strength corresponding to the coordinates (x, y) are calculated by referring to the third memory and based on the coordinates (x, y) within the field. Based on the results, the positioning deflector control circuit 15 is controlled.

(3) After performing the two corrections described above, the amount of correction to the focus is calculated by referring to the first memory and based on the information from the height-measuring device 22 that measures the height of the workpiece 9. Based on the results, the focus-adjusting lens 8A is controlled (A). Furthermore, the amount of correction to the size of the image to be written is calculated based on the amount of correction to the focus. Based on the results, the shaping deflector control circuit 14 is controlled (B). In addition, based on the amount of correction to the size, the amount of correction to the writing position made concomitantly with the correction of the size is calculated. Based on the results, the positioning deflector control circuit 15 is controlled (C).

(4) In addition to the above-described corrections, the amount of correction to the focus corresponding to the coordinates (x, y) is calculated based on the coordinates (x, y) within the field and by referring to the second memory (D). Based on the results, the focus-adjusting lens 8A is controlled. Furthermore, the amount of correction to the size of the image to be written is calculated based on the amount of correction to the focus (E). Based on the results, the shaping deflector control circuit 14 is controlled. Additionally, the amount of correction to the writing position concomitantly with the correction of the size is calculated based on the amount of correction to the size. Based on the results, the positioning deflector control circuit 15 is controlled (F).

The summary described so far is slightly supplemented now. The process steps (1) and (2) are corrections regarding the deflection. The process steps (3) and (4) are corrections regarding the focus. The steps contain corrections of the size concomitantly with the correction of the focus and the correction of the deflection concomitantly with the correction of the size. In the steps (1) and (3), the rate of correction is constant within the same field. On the other hand, in the steps (2) and (4), the rate of correction varies according to the coordinates (x, y) within the field.

The operation is next described in detail based on the summary described above. The data transfer circuit 13 calculates the coefficient of correction of the field size concomitantly with variations in the height of the workpiece based on the results of the measurement performed by the height-measuring device 22 and on the coefficient h obtained by referring to the first memory. The deflection value corrected using this is sent to the positioning deflector control circuit 15. In response to this, the positioning deflector control circuit 15 drives the positioning deflector 10. In consequence, the deflection strength of the positioning deflector 10 is corrected by the corrective coefficient and controlled.

Then, the data transfer circuit 13 obtains the corrective coefficient of the deflection strength concomitantly with the deflection by referring to the third memory and based on the values of the coordinates x and y of the position where an image is to be written within the field. The deflection value corrected using this is sent to the deflector control circuit 15. In response to this, the deflector control circuit 15 drives the positioning deflector 10. As a result, deviation of the deflection position attributed to deflection error of the image field is also corrected.

Because of the process described so far, if the height of the workpiece 9 varies, or if the positioning deflector 10 has image field curvature, the positional deviation is corrected provided that the image to be written is sufficiently small.

After the correction of the size of the field concomitantly with variations in the height of the workpiece 9 and the correction of the deflection strength concomitantly with the deflection have been made as described above, the data transfer circuit 13 first refers to the first memory according to the value of the height of the workpiece 9 obtained from the height-measuring device 22 and reads out the amount of correction to focus $\Delta i_z$ and corrective coefficient k. Alternatively, the circuit may refer to the first memory, read out the corrective coefficient k, and calculate the amount of correction to focus as $\Delta i_z = (\Delta z/z_0)/k$ from a reference height $z_0$ and from the amount of variation $\Delta z$ from the reference height.

Then, the data transfer circuit 13 sends out the results to the focus-adjusting lens control circuit 16A. In response to the incoming results, the control circuit 16A controls the focus-adjusting lens 8A. Furthermore, the data transfer circuit 13 calculates the product $(m \cdot k \cdot \Delta i)$ of the dimension m to be written, the corrective coefficient k, and the amount of correction to focus $\Delta i$, and finds a corrected size $(m - m \cdot k \cdot \Delta i)$. The result is sent to the shaping deflector control circuit 14, which in turn drives the shaping deflector 6 using the corrected size $(m - m \cdot k \cdot \Delta i)$.

A half of the correcting size $(m \cdot k \cdot \Delta i)$ is regarded as a correcting value for the position concomitantly with the correction of the size and sent to the positioning deflector control circuit 15. In response to this, the deflector control circuit 15 performs the correction corresponding to the amount of correction and drives the positioning deflector 10. Thus, corrections regarding the size of the image associated with the height of the workpiece 9 and writing position are completed.

In addition to the corrections regarding the size of the image associated with the height of the workpiece 9 and writing position, the following correction is made.

The data transfer circuit 13 refers to the second memory according to the value of the coordinate x within the field of the image to be written and obtains the excitation of the focus-adjusting lens 8A, i.e., the amount of correction to the focus in the X-direction $\Delta i_x$. Similarly, with respect to the Y-direction, the circuit obtains $\Delta i_y$. These are summed up to yield the amount of correction to focus, $\Delta i = \Delta i_x + \Delta i_y$.

Then, the data transfer circuit 13 sends out the focus value corrected using the "amount of correction to focus" to the focus-adjusting lens control circuit 16A. Based on this value, the focus-adjusting lens control circuit 16A controls the focus-adjusting lens 8A. Furthermore, with respect to the X- and Y-directions, the transfer circuit calculates the products $(m_x \cdot k \cdot \Delta i_x)$ and $(m_y \cdot k \cdot \Delta i_y)$ of sizes $m_x$ and $m_y$ to be written, the corrective coefficient k, and the "amounts of correction to focus" $\Delta i_x$ and $\Delta i_y$, respectively, to find corrected sizes $(m_x - m_x \cdot k \cdot \Delta i_x)$ and $(m_y - m_y \cdot k \cdot \Delta i_y)$. The found sizes are sent to the shaping deflector control circuit 14. At this time, the values $m_x$ and $m_y$ have already undergone correction about the size of the image associated with the height of the workpiece 9.

When these values are sent to the focus-adjusting lens control circuit 16A and to the shaping deflector control circuit 14 from the data transfer circuit 13, the lens control circuit 16A excites the focus-adjusting lens 8A with the amount of excitation from which $\Delta i$ has been reduced. The shaping deflector control circuit 14 drives the shaping deflector 6 using the corrected sizes $(m_x - m_x \cdot k \cdot \Delta i_x)$ and $(m_y - m_y \cdot k \cdot \Delta i_y)$.

Half values of the correcting sizes $(m_x \cdot k \cdot \Delta i_x)$ and $(m_y \cdot k \cdot \Delta i_y)$ are sent as correcting values of the position used concomitantly with the corrections of the dimension to the positioning deflector control circuit 15. In response to the values, the control circuit 15 makes the corrections corresponding to the correcting values and drives the positioning deflector 10.

As a result, if the focus of the lens (in this embodiment, the resultant lens of the objective lens 8 and focus-adjusting lens 8A) is varied because the height of the workpiece 9 is not uniform, or if the focus of the lens is varied in a corresponding manner to defocus due to curvature of image field of the positioning deflector 10, the correction is so made that the size of the pattern written on the workpiece 9 remains unchanged. Furthermore, the writing position is corrected in a corresponding manner to the amount of correction to the size. Accordingly, every written portion within the field is made uniform in size. Hence, defective connections in the pattern due to deviations in size and writing position can be circumvented. Also, defective connection between adjacent fields in the pattern can be prevented.

In the description of the operations made so far, the operations are performed in the order (1)–(4) given in the summary. In actual instrumentation, this order is not essential. Rather, it is essential that the operations be performed in an order to achieve the highest speed within the gist of the invention described above.

Furthermore, in the above description, the focus on the workpiece 9 is determined based on the coordinates deflected within the field. The size of the image is corrected based on the determined focus. Also, as the size is corrected, the position is corrected. That is, the image size is corrected through the focus. Also, as the size is corrected, the position is corrected through the focus. In this method, however, it is conceivable that in actual instrumentation, the corrections produce quite small amounts of errors.

In this case, it may be conceivable that the image size is directly corrected without via the focus. In particular, in the above embodiment, only the amount of correction to focus (corrective coefficient) relative to the deflected coordinate within the field is stored in the second memory. A table of amounts of correction to the image size (corrective coefficients) may be created together with the amounts of correction to focus (corrective coefficients). If the amount of deflection or coordinate positions are determined within the field, the focus and image size are corrected by referring to the two tables and based on the determined amount of deflection or coordinate positions. Let $g_x$ be an x-direction coefficient dependent on the coordinate within the field. Then, the amount of correction $\Delta m_x$ to the size $m_x$ of the image taken in the X-direction can be given by $g_x m_x$ ($\Delta m_x = g_x m_x$). The amount of correction $\Delta x$ to the position $x$ in the X-direction when the image size is corrected is a half of the amount of correction to the image size in the X-direction, i.e., $\Delta x = \Delta m_x/2$. A similar theory applies to the Y-direction.

Corrections concerning the positioning deflector and shaping deflector have been mainly described so far. The charged-particle beam system has a built-in stigmator (not shown in FIG. 1). For example, when the focus of the lens (the resultant lens of the objective lens 8 and focus-adjusting lens 8A) of the stigmator is varied, the operating characteristics may vary. Accordingly, astigmatic correction conditions under which the stigmator operates precisely when the strength of the focus-adjusting lens 8A is varied while maintaining constant the status of the objective lens 8 are measured in advance. During writing, the stigmator can be controlled according to the strength of the adjusting lens 8A.

In the structure described above, the focus-adjusting lens 8A has been added to the objective lens 8. Where high-speed response is taken into account, addition of an auxiliary lens is preferable. In principle, however, the above-described various kinds of corrections can, of course, be made by directly controlling the objective lens 8 without adding the focus-adjusting lens 8A.

Additionally, in the above embodiment of the present invention, the lithographic system utilizes an electron beam. The invention can also be applied to a lithographic system using an ion beam.

Having thus described my invention with the detail and particularity required by the Patent Laws, what is desired protected by Letters Patent is set forth in the following claims.

The invention claimed is:

1. A charged-particle beam lithographic system designed (a) to create an image of an opening in a first aperture, (b) to focus the image onto a second aperture by a shaping lens, (c) to place the image in position on the second aperture by a shaping deflector, (d) to focus a charged-particle beam, which has a cross section of desired size and has been transmitted through the opening in the second aperture, by an objective lens, (e) to direct the focused beam at a workpiece, and (f) to deflect the charged-particle beam according to a deflection signal supplied to a positioning deflector to deflect the beam to vary the irradiation position on the workpiece, further comprising means for correcting beam size by controlling the shaping deflector according to the strength of the objective lens.

2. A charged-particle beam lithographic system as set forth in claim 1, wherein the irradiation position on the workpiece is corrected by controlling the positioning deflector based on the correction of the size.

3. A charged-particle beam lithographic system as set forth in any one of claims 1 and 2, wherein the strength of the objective lens is varied according to the height of the workpiece.

4. A charged-particle beam lithographic system as set forth in claim 3, wherein a relation between the height of said workpiece and strength of said objective lens and a corrective coefficient for the correction are stored in a memory.

5. A charged-particle beam lithographic system as set forth in any one of claims 1 and 2, wherein the strength of the objective lens is varied according to the deflection signal supplied to the positioning deflector.

6. A charged-particle beam lithographic system as set forth in claim 5, wherein a relation between the strength of the deflection signal supplied to said positioning deflector and the strength of said objective lens and a corrective coefficient for the correction are stored in a memory.

7. A charged-particle beam lithographic system as set forth in claim 6, wherein the deflection signal to said positioning deflector contains strength components for X-direction deflection and Y-direction deflection, respectively.

8. A charged-particle beam lithographic system designed (a) to create an image of an opening in a first aperture, (b) to focus the image onto a second aperture by a shaping lens, (c) to place the image in position on the second aperture by a shaping deflector, (d) to focus a charged-particle beam, which has a cross section of desired size and has been transmitted through the opening in the second aperture, by an objective lens, (e) to direct the focused beam at a workpiece, and (f) to deflect the charged-particle beam according to a deflection signal supplied to a positioning deflector to deflect the beam to vary the irradiation position on the workpiece;

means for correcting the strength of said objective lens according to the strength of the deflection signal supplied to said positioning deflector;

means for correcting the size of the beam by controlling the shaping deflector according to the strength of said deflection signal; and means for correcting the irradiation position on said workpiece by controlling said positioning deflector based on the correction of said size.

9. A charged-particle beam lithographic system as set forth in claim 8, wherein a relation between the strength of the deflection signal supplied to said positioning deflector and the strength of said objective lens, a relation between the strength of the deflection signal supplied to said positioning deflector and the correction of said size, and a corrective coefficient are stored in a memory.

10. A charged-particle beam lithographic system as set forth in claim 9, wherein the deflection signal to said positioning deflector contains strength components for X-direction deflection and Y-direction deflection, respectively.

11. A charged-particle beam lithographic system as set forth in any one of claims 1, 2, 8, 9, and 10, wherein said objective lens is fitted with a focus-adjusting lens which functions as an auxiliary lens for the objective lens and is capable of finely adjusting the focus of the objective lens.

12. A method for controlling a charged-particle beam lithographic system designed (a) to create an image of an opening in a first aperture, (b) to focus the image onto a second aperture by a shaping deflector, (c) to place the image in position on the second aperture by a shaping deflector, (d) to focus a charged-particle beam, which has a cross section of desired size and has been transmitted through the opening in the second aperture, by an objective lens, (e) to direct the focused beam at a workpiece, and (f) to deflect the charged-particle beam according to a deflection signal supplied to a positioning deflector to deflect the beam to vary the irradiation position on the workpiece, and correcting said beam size by controlling the shaping deflector according to the strength of the object lens.

13. A method for controlling a charged-particle beam lithographic system designed (a) to create an image of an opening in a first aperture, (b) to focus the image onto a second aperture by a shaping lens, (c) to place the image in position on the second aperture by a shaping deflector, (d) to focus a charged-particle beam, which has a cross section of desired size and has been transmitted through the opening in the second aperture, by an objective lens, (e) to direct the focused beam at a workpiece, and (f) to deflect the charged-particle beam according to a deflection signal supplied to a positioning deflector to deflect the beam to vary the irradiation position on the workpiece comprising the steps of:

correcting the strength of said objective lens according to the strength of the deflection signal supplied to said positioning deflector;

correcting said size of the beam by controlling the shaping deflector according to the strength of said deflection signal; and correcting the irradiation position on said workpiece by controlling said positioning deflector based on the correction of said size.

* * * * *